US010486449B2

(12) United States Patent
Rammah et al.

(10) Patent No.: US 10,486,449 B2
(45) Date of Patent: Nov. 26, 2019

(54) STRUCTURES FOR SECURING OPERATIONAL COMPONENTS IN A PORTABLE ELECTRONIC DEVICE

(71) Applicant: Apple Inc., Cupertino, CA (US)

(72) Inventors: Marwan Rammah, San Francisco, CA (US); Lee E. Hooton, Ridge, NY (US); Srikanth V. Thiruppukuzhi, San Jose, CA (US); Stoyan P. Hristov, San Jose, CA (US); Adam J. Brinkman, Sunnyvale, CA (US); James A. Bertin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/127,064

(22) Filed: Sep. 10, 2018

(65) Prior Publication Data

US 2019/0082546 A1    Mar. 14, 2019

Related U.S. Application Data

(60) Provisional application No. 62/557,090, filed on Sep. 11, 2017.

(51) Int. Cl.
*B41M 5/24* (2006.01)
*G06F 1/16* (2006.01)
(Continued)

(52) U.S. Cl.
CPC ............ *B41M 5/24* (2013.01); *F28F 21/084* (2013.01); *F28F 21/085* (2013.01);
(Continued)

(58) Field of Classification Search
CPC . B41M 5/24; H01P 3/08; H05K 1/181; H05K 5/0004; H05K 1/0216;
(Continued)

(56) References Cited

U.S. PATENT DOCUMENTS 5,991,155 A    11/1999  Kobayashi et al.
7,119,419 B2   10/2006  Kato et al.
(Continued)

FOREIGN PATENT DOCUMENTS

WO    2005048298 A2    5/2005

OTHER PUBLICATIONS

"Gorilla University: Quantum Induction Wireless Charging", Quantum Induction Technology—Gorilla Gadgets; https://gorillagadgets.com/blogs/gorilla-gadgets-blog/qi-quantum-induction-wireless-charging; Aug. 3, 2017, 9 pages.
(Continued)

*Primary Examiner* — Abhishek M Rathod
(74) *Attorney, Agent, or Firm* — Dickinson Wright RLLP

(57) ABSTRACT

This application relates to an enclosure for a portable electronic device. The enclosure includes a protruding trim structure having walls that define a cavity, where the protruding trim structure is capable of carrying an electronic component within the cavity. The enclosure further includes a support plate that is coupled to the enclosure and the protruding trim structure, and a brace structure that secures and supports the protruding trim structure such that when the protruding trim structure is exposed to an external load during a drop event, the protruding trim structure is capable of redirecting an amount of the load away from the protruding trim structure and the electronic component.

20 Claims, 14 Drawing Sheets

(51) Int. Cl.
| | |
|---|---|
| H04M 1/02 | (2006.01) |
| H01P 3/08 | (2006.01) |
| H05K 1/02 | (2006.01) |
| H05K 1/18 | (2006.01) |
| H05K 5/00 | (2006.01) |
| H05K 5/02 | (2006.01) |
| H05K 5/03 | (2006.01) |
| H05K 5/06 | (2006.01) |
| H05K 9/00 | (2006.01) |
| F28F 21/08 | (2006.01) |
| H05K 7/20 | (2006.01) |
| H01R 12/79 | (2011.01) |
| H05K 1/14 | (2006.01) |
| H02J 50/10 | (2016.01) |
| H02J 7/02 | (2016.01) |

(52) U.S. Cl.
CPC .......... *G06F 1/1626* (2013.01); *G06F 1/1656* (2013.01); *H01P 3/08* (2013.01); *H04M 1/0202* (2013.01); *H05K 1/0216* (2013.01); *H05K 1/181* (2013.01); *H05K 5/0004* (2013.01); *H05K 5/0017* (2013.01); *H05K 5/0086* (2013.01); *H05K 5/0217* (2013.01); *H05K 5/03* (2013.01); *H05K 5/069* (2013.01); *H05K 7/2039* (2013.01); *H05K 9/0007* (2013.01); *H05K 9/0075* (2013.01); *H01R 12/79* (2013.01); *H02J 7/025* (2013.01); *H02J 50/10* (2016.02); *H04M 1/026* (2013.01); *H04M 1/0264* (2013.01); *H04M 1/0283* (2013.01); *H05K 1/147* (2013.01); *H05K 2201/10189* (2013.01)

(58) Field of Classification Search
CPC .... H05K 7/2039; H05K 5/0086; H05K 5/069; H05K 5/0217; H05K 5/0017; H05K 5/03; H05K 9/0075; H05K 9/0007; H05K 2201/10189; H05K 1/147; F28F 21/084; F28F 21/085; H04M 1/0202; H04M 1/0283; H04M 1/026; G06F 1/1626; G06F 1/1656; H02J 50/10; H02J 7/025; H01R 12/79
See application file for complete search history.

(56) References Cited

U.S. PATENT DOCUMENTS

| | | | |
|---|---|---|---|
| 7,292,441 | B2 | 11/2007 | Smalc et al. |
| 7,583,834 | B2 | 9/2009 | McCollough et al. |
| 7,652,729 | B2 | 1/2010 | Minaguchi et al. |
| 7,760,289 | B2 | 7/2010 | Nakanishi et al. |
| 8,110,744 | B2 | 2/2012 | Wong et al. |
| 8,281,483 | B2 | 10/2012 | Hofmann et al. |
| 8,669,483 | B2 | 3/2014 | Shimura et al. |
| 8,740,634 | B2 | 6/2014 | Uesaka et al. |
| 8,762,749 | B2 | 6/2014 | Azancot et al. |
| 8,960,818 | B2 | 2/2015 | Myers et al. |
| 9,143,586 | B2 | 9/2015 | Allore et al. |
| 9,380,714 | B2 | 6/2016 | Shin et al. |
| 9,469,469 | B2 * | 10/2016 | Rayner ................ G06F 1/1626 |
| 9,583,256 | B2 | 2/2017 | Lapetina et al. |
| 9,601,286 | B2 | 3/2017 | Lynch et al. |
| 9,973,013 | B2 | 5/2018 | Yan |
| 10,003,371 | B1 * | 6/2018 | Given .................. H04B 1/3888 |
| 10,218,830 | B1 * | 2/2019 | Liu ...................... H04M 1/0264 |
| 2003/0066672 | A1 | 4/2003 | Watchko et al. |
| 2008/0151503 | A1 | 6/2008 | Aapro et al. |
| 2008/0164840 | A1 | 7/2008 | Kato et al. |
| 2010/0072952 | A1 | 3/2010 | Nakajima |
| 2012/0234524 | A1 | 9/2012 | Fan et al. |
| 2013/0033581 | A1 * | 2/2013 | Woo ..................... H04N 5/2257 348/47 |
| 2014/0118929 | A1 | 5/2014 | Leung et al. |
| 2014/0177197 | A1 | 6/2014 | Lampinen |
| 2014/0192467 | A1 | 7/2014 | Kwong |
| 2014/0367369 | A1 | 12/2014 | Nashner et al. |
| 2015/0111623 | A1 | 4/2015 | Hegemier et al. |
| 2015/0198864 | A1 * | 7/2015 | Havskjold ............. G03B 17/02 455/556.1 |
| 2015/0241931 | A1 | 8/2015 | Carnevali et al. |
| 2017/0085764 | A1 * | 3/2017 | Kim ..................... H04N 5/2258 |
| 2017/0300085 | A1 | 10/2017 | Hintermann |
| 2018/0053981 | A1 | 2/2018 | Bae et al. |
| 2018/0084680 | A1 | 3/2018 | Jarvis et al. |
| 2018/0190408 | A1 | 7/2018 | Chin |
| 2019/0041909 | A1 * | 2/2019 | Pakula .................. G06F 1/1626 |
| 2019/0082083 | A1 * | 3/2019 | Jarvis ................... H04N 5/2252 |

OTHER PUBLICATIONS

"Magnetic shielding materials to protect sensitive electronics", Electronic Products, https://www.electronicproducts.com/Packaging_and_Hardware/Shielding_and_Insulation/Magnetic_shielding_materials_to_protect_sensitive_electronics.aspx, posted on Sep. 22, 2014, 3 pages.

* cited by examiner

STRUCTURES FOR SECURING OPERATIONAL COMPONENTS IN A PORTABLE ELECTRONIC DEVICE

CROSS-REFERENCE TO RELATED APPLICATIONS

The present application claims the benefit of U.S. Provisional Application No. 62/557,090, entitled "PORTABLE ELECTRONIC DEVICE," filed Sep. 11, 2017, which is incorporated by reference herein in its entirety for all purposes.

This patent application is also related and incorporates by reference in their entirety each of the following co-pending patent applications:
(i) U.S. patent application Ser. No. 16/127,043 entitled "THERMALLY CONDUCTIVE STRUCTURE FOR DISSIPATING HEAT IN A PORTABLE ELECTRONIC DEVICE" by HOOTON et al. filed Sep. 10, 2018;
(ii) U.S. patent application Ser. No. 16/127,055 entitled "PLATE FOR MAGNETIC SHIELDING OF AN OPERATIONAL COMPONENT IN A PORTABLE ELECTRONIC DEVICE" by WAH et al. filed Sep. 10, 2018;
(iii) U.S. patent application Ser. No. 16/127,071 entitled "SPACE-EFFICIENT FLEX CABLE WITH IMPROVED SIGNAL INTEGRITY FOR A PORTABLE ELECTRONIC DEVICE" by SLOEY et al. filed Sep. 10, 2018; and
(iv) U.S. patent application Ser. No. 16/126,984 entitled "SUBSTRATE MARKING FOR SEALING SURFACES" by HAWTHORNE et al. filed Sep. 10, 2018.

FIELD

The described embodiments relate generally to structural components for securing operational components in a portable electronic device. More particularly, the described embodiments relate to support structures for securing the operational components and preventing these operational components from dislodging out of place in the event that the portable electronic device is subject to a load associated with a drop event.

BACKGROUND

Recent technological advances have increased the capacity for manufacturers to integrate more operational components (e.g., camera, processor, antenna, processors, etc.) within the small cavity of a portable electronic device. However, due to the precision fit by which these operational components are assembled and fit within such a small cavity, these operational components may be susceptible to shifting and becoming misaligned when the portable electronic device is subject to a load associated with a drop event. Consequently, the misalignment of these operational components may lead to premature failure of these operational components. Accordingly, there is a need for the enclosure to incorporate supporting structures that are capable of dispersing the energy associated with the load, thereby preventing these operational components from shifting out of alignment.

SUMMARY

This paper describes various embodiments that relate to structural components for securing operational components in a portable electronic device. In particular, the various embodiments relate to support structures for securing the operational components and preventing these operational components from dislodging out of place in the event that the portable electronic device is subject to a load associated with a drop event.

According to some embodiments, a portable electronic device is described. The portable electronic device includes an enclosure, a trim structure that protrudes from the enclosure, where the trim structure includes walls that define a cavity capable of carrying an electronic component within the cavity, a support plate that couples together the enclosure and the trim structure, and a brace structure that couples together the trim structure and the support plate, where the trim structure and the brace structure define a load path such that a load applied to the trim structure is redirected by the load path towards the brace structure and away from the electronic component.

According to some embodiments, a portable electronic device is described. The portable electronic device includes an enclosure having walls that define a cavity. The portable electronic device further includes a trim structure that is coupled to and extends from the enclosure, where the trim structure includes an overhang that cooperates with the walls to further define the cavity. The portable electronic device further includes a support plate that overlays at least a portion of the trim structure, where the overhang includes an engagement surface that is disposed between the support plate and a cover layer of the trim structure, and a brace structure that overlays at least a portion of the trim structure and at least a portion of the support plate, where the brace structure includes a flange that (i) is coupled to at least one of the walls, and (ii) extends away from the support plate.

According to some embodiments, a portable electronic device is described. The portable electronic device includes an enclosure having walls that define a cavity capable of carrying an electronic component therein. The portable electronic device includes a brace structure that includes at least one flange, where the at least one flange is secured to at least one of the walls. The portable electronic device further includes a support plate that is disposed along external surfaces of the brace structure and the at least one wall that is secured to the at least one flange, and a trim structure that is coupled to the at least one wall that is secured to the at least one flange, where the trim structure includes sides that (i) extend away from the support plate, and (ii) cooperate with the at least one wall to further define the cavity.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
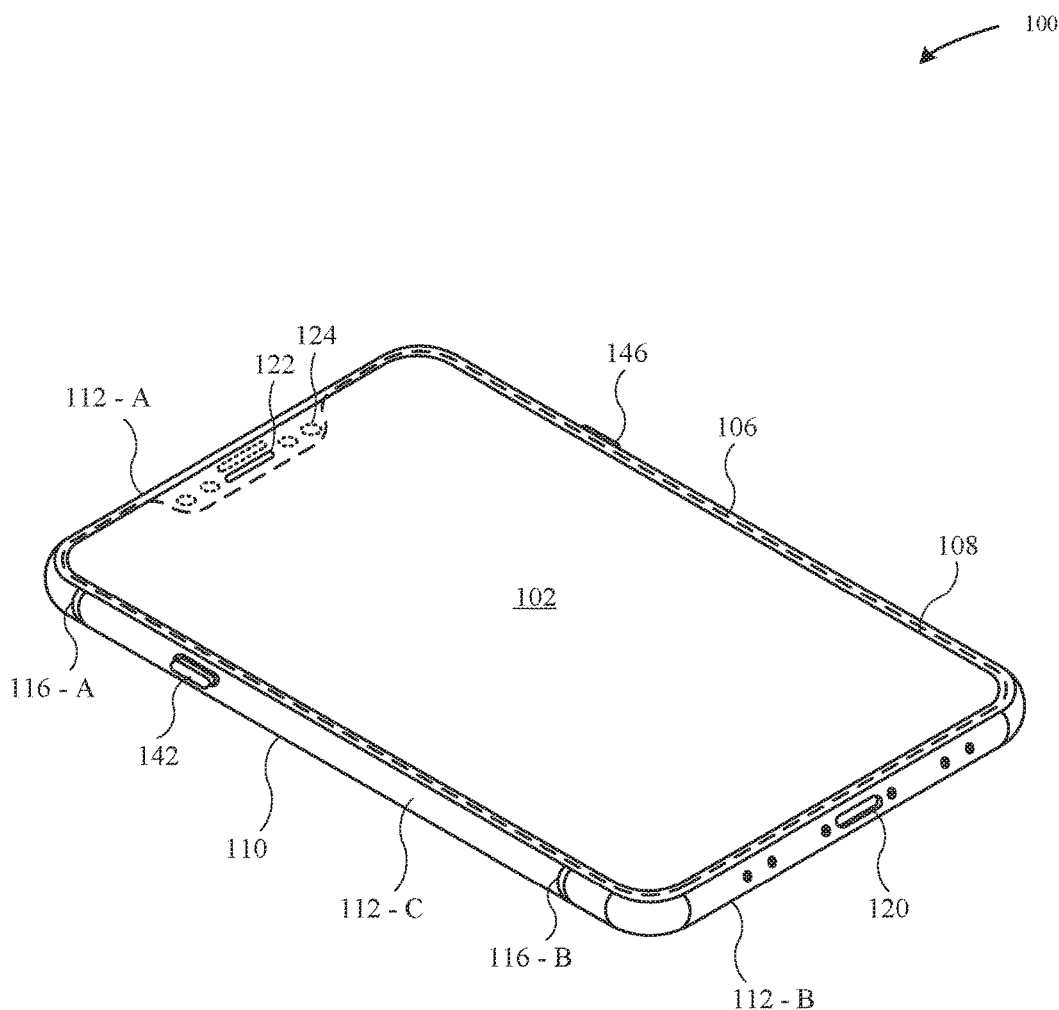
FIGS. 1A-1B illustrate perspective views of a portable electronic device that includes support structures for securing operational components, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to support structures for securing operational components in a portable electronic device. In particular, the support structures are capable of preventing these operational components from becoming misaligned in the event that the portable electronic device is subject to a load associated with a drop event. As used herein, the term "load path" may refer to the path of maximum stress on a load-bearing member in response to an applied load. In some examples, the main portion of the load path is transferred through the stiffest route of the support structures. In some examples, the load path is based on the structural stiffness of these support structures.

Although recent technological advances and increased consumer demand have driven manufacturers to incorporate additional operational components (e.g., processors, antennas, front cameras, rear cameras, haptic feedback components, etc.) into portable electronic devices, this has become progressively more challenging due to the small cavities of these enclosures of these portable electronic devices. Consequently, when the portable electronic device is subject to a load associated with a drop event (e.g., dropping the portable electronic device on a hard surface, etc.), these operational components are susceptible to shifting and becoming temporarily and/or permanently misaligned. Unfortunately, the misalignment of these operational component(s) often leads to premature failure. Further problematic is that due to the small cavities of these portable electronic devices, enclosure components (e.g., trim structures, etc.) may be required to increase the thickness of the enclosure to fit operational components that are unable to fit within the standard thickness of the enclosure. However, these enclosure components may offset the balance of the weight of the portable electronic device during a drop event, thereby causing these enclosure components to disproportionately receive the load associated with the drop event.

To cure the aforementioned deficiencies, the systems and techniques described herein relate to support structures (e.g., brace structures, etc.) that are capable of backing and supporting enclosure components such as trim structures, back walls, glass cover layers, and the like during a drop event. Beneficially, these support structures can limit and/or prevent deflection of these enclosure components, thereby minimizing damage and misalignment of these operational components. Additionally, in some examples, these support structures are tuned to have varying degrees of stiffness so as provide an optimal load dispersion path. For instance, these support structures may be tuned to selectively cause deflection of the load away from enclosure components having a marginal amount of stiffness and instead towards the enclosure, which is generally formed of a unibody construction and, as a result, has a greater amount of stiffness capable of bearing the stress associated with the load.

According to some embodiments, a portable electronic device is described. The portable electronic device includes an enclosure, a trim structure that protrudes from the enclosure, where the trim structure includes walls that define a cavity, and the trim structure is capable of carrying an electronic component within the cavity, a support plate that couples together the enclosure and the trim structure, and a brace structure that couples together the trim structure and the support plate, where the trim structure and the brace structure define a load path such that a load applied to the trim structure is redirected by the load path towards the brace structure and away from the electronic component.

These and other embodiments are discussed below with reference to FIGS. 1A-1B and 3-12. However, those skilled in the art will readily appreciate that the detailed description given herein with respect to these figures is for explanatory purposes only and should not be construed as limiting.

Figure 1B:
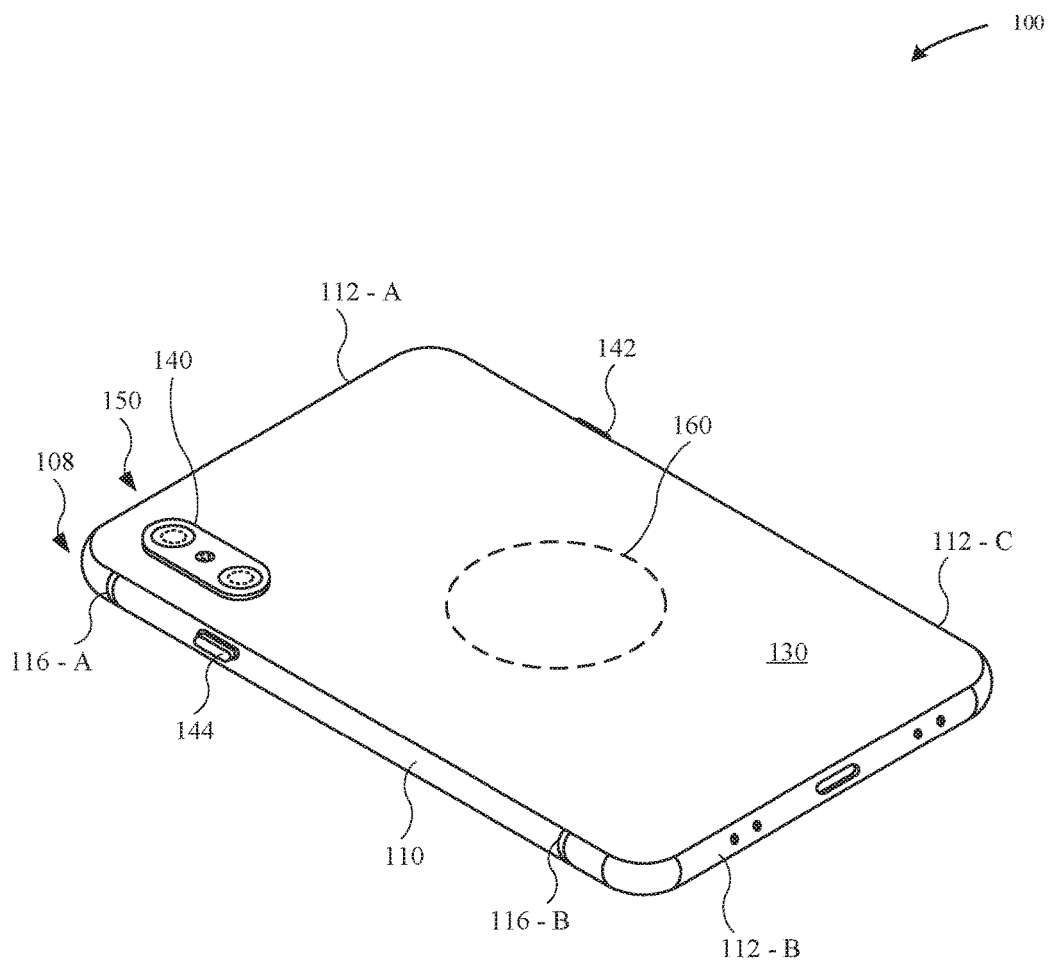

FIGS. 1A-1B illustrate a portable electronic device that includes support structures, in accordance with various embodiments. In particular, the support structures are capable of supporting operational components that are carried within a cavity of an enclosure of the portable electronic device. According to some examples, the portable electronic device can include a computing device, a smartphone, a laptop, a smartwatch, a fitness tracker, a mobile phone, a wearable consumer device, and the like. The enclosure of the portable electronic device can also be referred to as a housing.

FIG. 1A illustrates a first perspective view of the portable electronic device 100, where the portable electronic device 100 includes an enclosure 110 having walls that define a cavity (not illustrated), where one or more operational components are carried within the cavity. The enclosure 110 includes a top wall 112-A, a bottom wall 112-B, and side walls 112-C.

FIG. 1A illustrates that the portable electronic device 100 includes a display assembly 102 that covers a majority of a top surface of the enclosure 110. The display assembly 102 can include a capacitive unit and/or a force detection unit that is capable of detecting an input at the display assembly 102 and presenting a corresponding graphical output at the display assembly 102. In some embodiments, the display assembly 102 is overlaid by a protective cover 108, where the protective cover 108 is secured with a trim structure 106. In particular, the trim structure 106 may be joined to the enclosure 110 with an attachment feature, such as an adhesive, a weld, and the like. The protective cover 108 may prevent surface abrasions and scratches from damaging the display assembly 102. The protective cover 108 may be formed from a transparent material, such as glass, plastic, sapphire, or the like.

In some embodiments, the top wall 112-A may be separated from the bottom wall 112-B by a dielectric material 116-A, B, and the side walls 112-C may be separated from the top wall 112-A and the bottom wall 112-B by the dielectric material 116-A, B. The dielectric material 116-A, B can include plastic, injection-molded plastic, polyethylene terephthalate ("PET"), polyether ether ketone ("PEEK"), ceramic, and the like. By incorporating the dielectric material 116-A, B, the walls 112-A, B, C are capable of being electrically isolated from each other.

According to some embodiments, the portable electronic device 100 includes a button 146 and a switch 142 that are carried along the side wall 112-C. The bottom wall 112-B includes a connector 120 that is capable of providing data and/or power to the portable electronic device 100. In some examples, the connector 120 refers to a bus and power connector.

According to some embodiments, the portable electronic device 100 includes a notch 122 in proximity to the top wall 112-A. As illustrated in FIG. 1A, the notch 122 is defined by a cut-out of the protective cover 108. The notch 122 includes one or more electronic components 124 (e.g., infrared detector, front-facing camera, etc.). In some examples, the one or more electronic components 124 may be utilized for facial recognition. It should be noted that the supporting structures described herein may be utilized to secure these electronic components 124 such as to prevent these electronic components 124 from becoming dislodged or misaligned when the portable electronic device 100 experiences a load event.

According to some examples, at least one of the top wall 112-A, the bottom wall 112-B, or the side wall 112-C may be formed of material other than metal. Beneficially, the use of non-metal material can reduce the amount of electromagnetic interference associated with the enclosure 110 and a wireless transceiver that is carried within the enclosure 110. Additionally, the use of non-metal material reduces the amount of parasitic capacitance between any metal support structures that are carried within the cavity and the enclosure 110. According to some examples, the non-metal material includes glass, plastic, ceramic, and the like. Although non-metal material such as glass is beneficial in permitting electromagnetic waves to pass through the enclosure 110, the glass is also more susceptible than metal to cracking or deforming when the portable electronic device 100 experiences a drop event.

According to some embodiments, the portable electronic device 100 carries one or more operational components within a cavity (not illustrated) of the portable electronic device 100. These operational components may include a circuit board, an antenna, a multi-core processor, a haptic feedback module, a camera, a sensor, an IR detector, an inductive charging coil, and the like.

FIG. 1B illustrates a second perspective view of the portable electronic device 100, in accordance with some embodiments. As illustrated in FIG. 1B, an operational component 150 is carried at least in part within a protruding trim structure 140. The protruding trim structure 140 is disposed in proximity to a corner 108 of the enclosure 110. In some examples, proximity may refer to the operational component 150 is a distance of less than about 50 mm from the corner 108. As illustrated in FIG. 1B, the operational component 150 is a camera system having dual lenses (e.g., wide and a telephoto, etc.). Additionally, the camera system may include a flash module.

As illustrated in FIG. 1B, the protruding trim structure 140 is secured to and extends from a back wall 130 of the portable electronic device 100. According to some examples, the back wall 130 is formed of a material other than metal. The non-metal material enables a magnetic field to pass through the enclosure 110 in order to charge wireless charging coils 160, such as magnetic cores that include ferrites.

Figure 2:
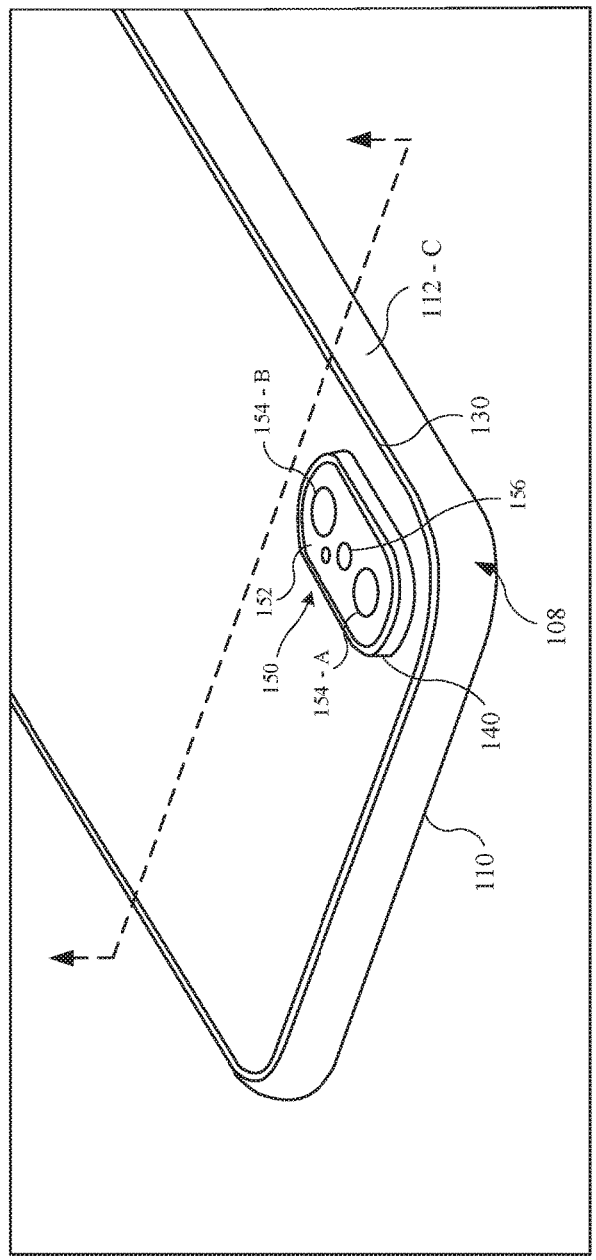
FIG. 2 illustrates a perspective view of a portable electronic device that includes support structures for securing operational components, in accordance with some embodiments.

FIG. 2 illustrates a magnified perspective view of a portable electronic device 200 that includes support structures capable of supporting operational components, in accordance with some embodiments. In particular, FIG. 2 illustrates that a back wall 130 of the enclosure 110 includes a protruding trim structure 140 that is joined to and extends from the back wall 130. In particular, the protruding trim structure 140 has a thickness that is sufficient to accommodate an operational component 150. For example, the operational component 150 has dimensions (i.e., shape, height, width, etc.) that exceeds the limitations of the dimensions of the enclosure 110. In other words, the protruding trim structure 140 enables the operational component 150 to extend past the dimensions of the enclosure 110. Therefore, by carrying at least a part of the operational component 150 within a cavity of the protruding trim structure 140, the operational component 150 may be carried by the portable electronic device 200. In some examples, the protruding trim structure 140 is secured to a rear trim structure (not illustrated) and walls of the enclosure 110.

According to some examples, the protruding trim structure 140 extends between about 0.5 mm to about 10 mm from an external surface of the back wall 130. In other words, the protruding trim structure 140 may have a thickness that is between about 0.5 mm to about 10 mm. In other examples, the protruding trim structure 140 extends between about 1 mm to about 50 mm from the external surface of the back wall 130. However, it should be noted that the protruding trim structure 140 may be of any thickness as suitable for carrying the operational component 150.

Although the protruding trim structure 140 imparts benefits to the portable electronic device 200, such as the capability to carry an operational component 150 having dimensions greater than the enclosure 110 of the portable electronic device 200, the protruding trim structure 140 may also be susceptible to receiving a load force when the portable electronic device 200 is dropped on the floor. In particular, the protruding trim structure 140 may offset the balance of the enclosure 110 so as to potentially favor causing an impact along the corner 108 of the portable electronic device 200. Consequently, the impact causes a load path to travel through the protruding trim structure 140, thereby causing the operational component 150 to become dislodged and misaligned relative to other structures. Additionally, the load path may travel to the back wall 130 and the back trim structure that surrounds the perimeter of the back wall 130.

Figure 3:
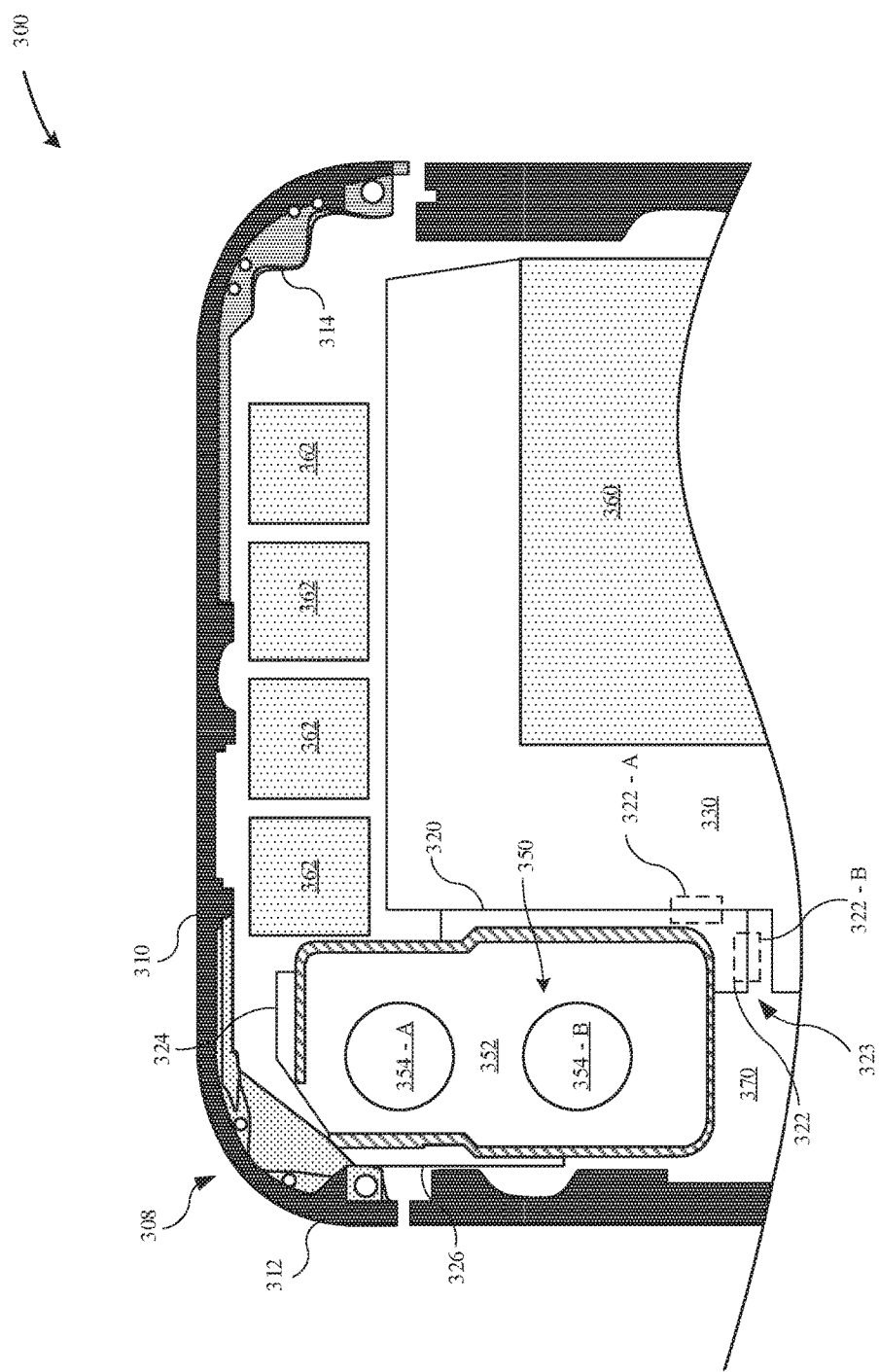
FIG. 3 illustrates a partial top view of a portable electronic device that includes support structures for securing operational components, in accordance with some embodiments.

FIG. 3 illustrates a magnified cross-sectional view of a portable electronic device 300 as taken along the A-A reference line of the portable electronic device 200 illustrated in FIG. 2, in accordance with some embodiments. FIG. 3 illustrates that the portable electronic device 300 includes an enclosure 310 that carries an image capture system 350 within a cavity 370, where the image capture system 350 includes a wide lens 354-A and a telephoto lens 354-B. Additionally, the image capture system 350 is overlaid by a cover layer 352. Furthermore, the enclosure 310 includes a power supply unit 360 (e.g., a rechargeable battery, etc.) and electronic components 362, such as an IR detector, front-facing camera, and the like.

As illustrated in FIG. 3, the enclosure 310 includes a brace structure 320 that surrounds and/or supports the image capture system 350. The brace structure 320 may be welded to a circuit board or support plate so that the brace structure is capable of coordinating with metal material of the enclosure 310 to define an active antenna. Indeed, the enclosure 310 may be formed of metal, such as stainless steel, aluminum, titanium, and the like such that the enclosure 310 functions as an active antenna. In some examples, the enclosure 310 includes different metal sections, such as a long arm section 312 and a short arm section 314 that are capable of transmitting and/or receiving high-frequency electromagnetic waves. Additionally, in some examples, the brace structure 320 includes an antenna arm that is welded to the brace structure that may be utilized to transmit high-frequency electromagnetic waves.

Although illustrated in greater detail with reference to FIG. 5, the brace structure 320 includes one or more flanged sections having walls that extend from the circuit board or the support plate. In some examples, the walls may extend along the length of the brace structure 320, although the walls may be of varied heights so as to provide variations in stiffness across the length of the brace structure 320. Stiffness may be defined as a relationship between stress (force per unit area) and strain (proportional deformation) in a material in the linear elasticity regime of a uniaxial deformation. In some examples, the brace structure 320 is formed of metal having a high degree of stiffness. Thus, the brace structure 320 provides a degree of stiffness through at least a part of the enclosure that is not covered by any one of the top wall 112-A, the bottom wall 112-B, or the side walls 112-C. Beneficially, the brace structure 320 is capable of providing an opposing an amount of stiffness such as when a load is applied against a top surface of the enclosure 310. In some examples, the walls of the brace structure 320 may extend upwards towards the display assembly 108. Additionally, because the walls of the brace structure 320 are formed of metal, the walls of the brace structure 320 are also capable of functioning as an active antenna. Indeed, the taller the walls of the brace structure 320, the closer the brace structure 320 will be to the metal material of the enclosure 110; thus, the brace structure 320 may also be utilized as an antenna. However, it should be noted that consideration is made to minimizing parasitic capacitance between the brace structure 320 and the enclosure 310.

As illustrated in FIG. 3, the brace structure 320 includes a first flanged section 322 that is positioned furthest from the corner 308 of the enclosure 110. The first flanged section 322 is bordered/attached to a support plate 330 as indicated by region 322-A of the first flanged section. As the length of the region 322-A of the first flanged section 322 is continually bordered by the support plate 330, the region 322-A demonstrates generally constant stiffness throughout. Additionally, the first flanged section 322 of the brace structure 320 include a thick wall that imparts the region 322-A with increased stiffness. The increased stiffness of the region 322-A can prevent the first flanged section 322 from deflecting into the support plate 330 when the portable electronic device 300 is subject to a drop event. Additionally, if the support plate 330 is formed of glass, this increased stiffness can prevent the first flanged section 322 from potentially cracking the support plate 330.

Furthermore, the first flanged section 322 includes a region 322-B that is associated with a gradually decreased stiffness relative to the region 322-A. In particular, the first flanged section 322 is characterized as having a reduced stiffness along the corner of the brace structure 320 that is furthest from the corner 308, which may attributed to a gap 323 that separates the region 322-B of the first flanged section 322 from the support plate 330. Beneficially, due to the reduced stiffness of the region 322-B, this gap 323 prevents the first flanged section 322 from deflecting into the support plate 330 when the portable electronic device 300 is subject to a drop event.

Furthermore, FIG. 3 illustrates that the brace structure 320 includes a second flanged section 324 and a third flanged section 326. In some examples, the second and third flanged sections 324, 326 include walls that enclose at least a part of the operational component 350. Additionally, the walls of the second and third flanged sections 324, 326 are capable of pushing back against a load that is exerted against a top surface of the enclosure 110. In some examples, any one of the second or third flanged section 324, 326 can include gaps or seams so as to minimize parasitic capacitance and/or increase antenna performance. However, by including such gaps or seams, these second or third flanged sections 324, 326 are more susceptible to bending.

Figure 4:
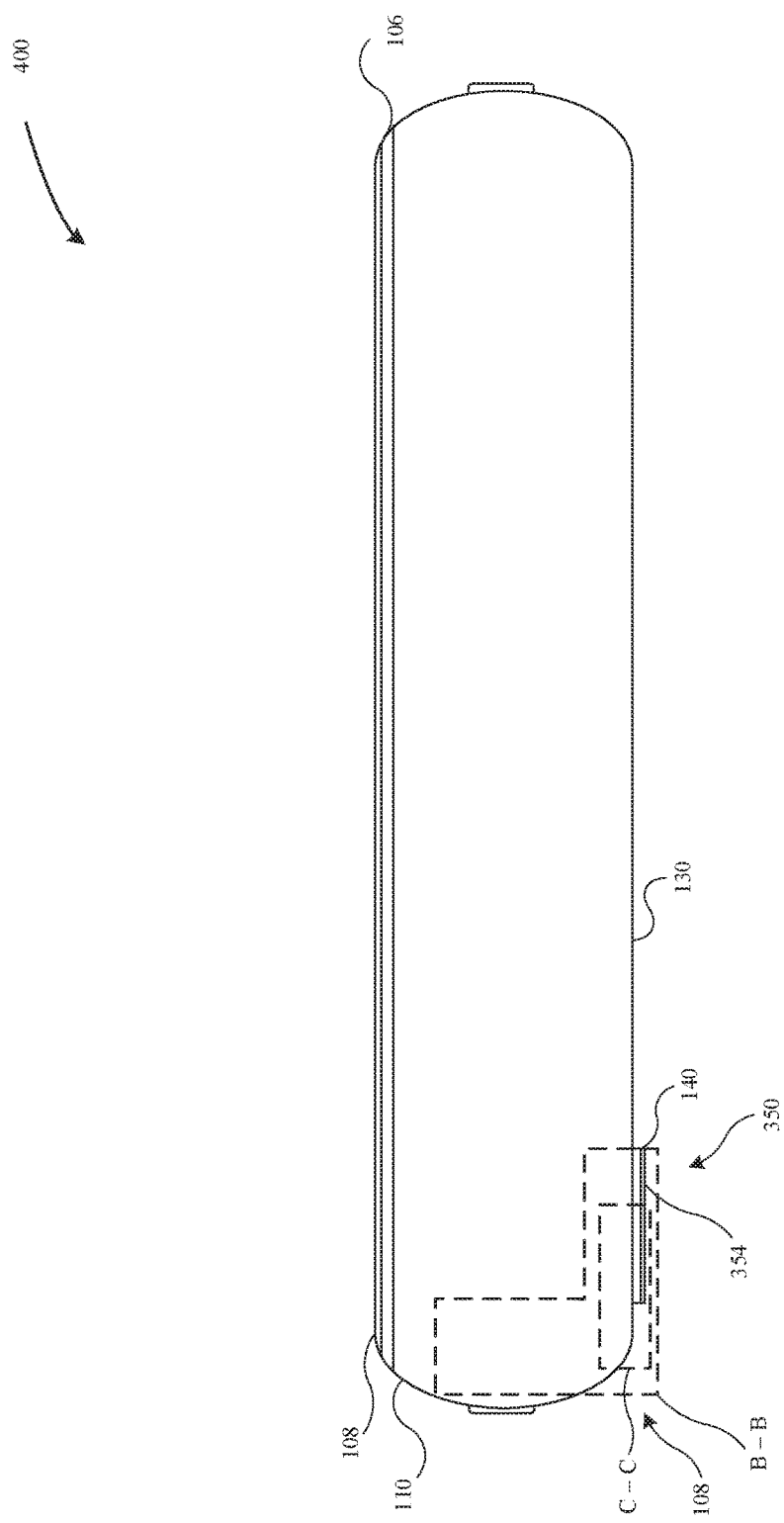
FIG. 4 illustrates a side view of a portable electronic device that includes support structures for securing operational components, in accordance with some embodiments.

FIG. 4 illustrates a side view of a portable electronic device 400, in accordance with some embodiments. As illustrated in FIG. 4, the portable electronic device 400 includes an enclosure 110 that carries operational components within a cavity. Additionally, the enclosure 110 is coupled to a protruding trim component 140, where the protruding trim component 140 is positioned in proximity to a corner 108 of the enclosure 110. The protruding trim component 140 is characterized as having a thickness and a shape that is sufficient to carry an operational component 350 at least in part within a cavity (not illustrated) of the protruding trim component 140. As illustrated in FIG. 4, the operational component 350 is overlaid by a cover layer 354 that prevents and/or minimizes damage to the operational component 350, such as when the portable electronic device 400 is subject to a drop event.

Figure 5:
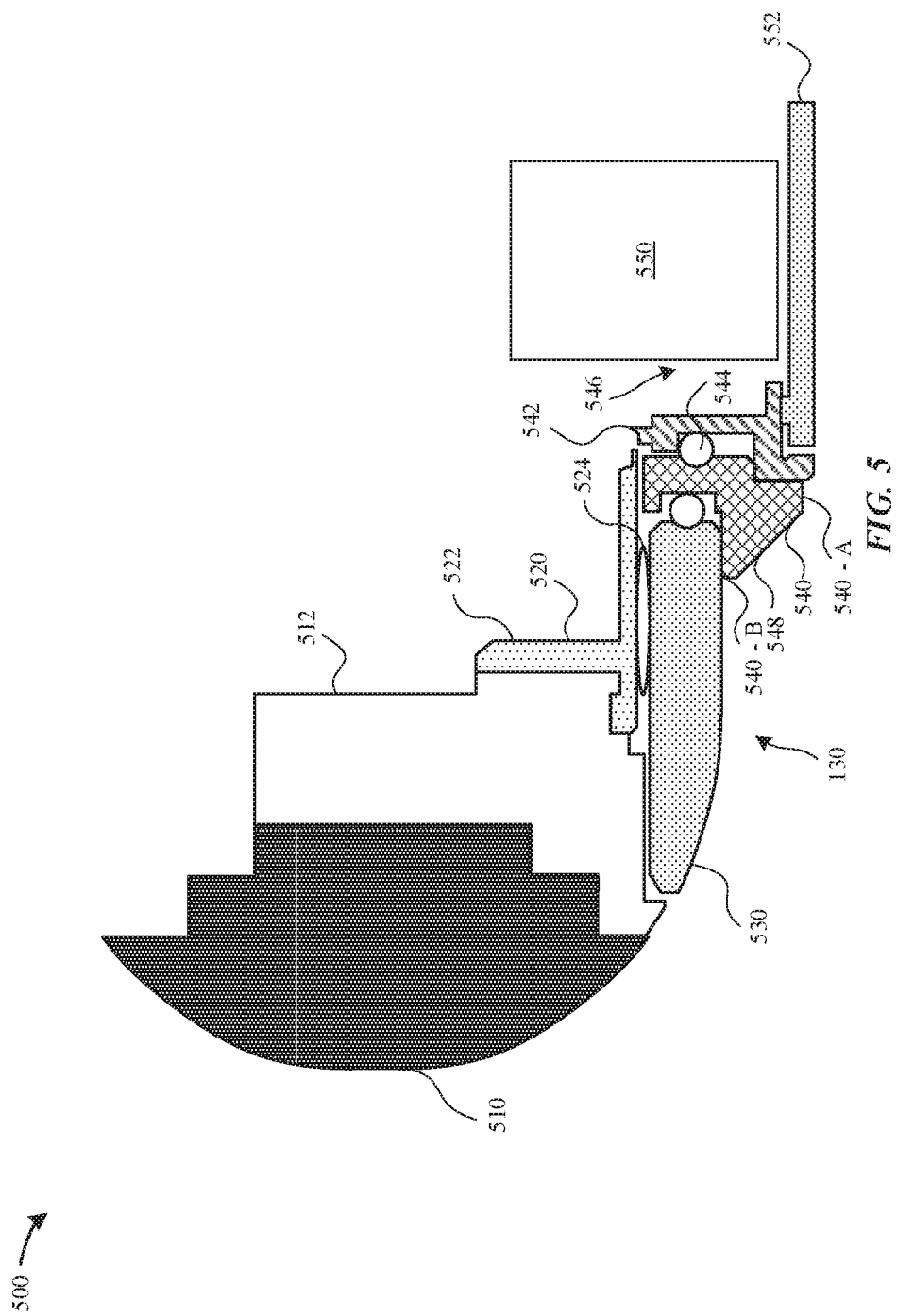
FIG. 5 illustrates a partial cross-sectional view of a portable electronic device that includes support structures for securing operational components, in accordance with some embodiments.

FIG. 5 illustrates a cross-sectional view of a portable electronic device 500 taken along the reference section B-B of the portable electronic device 400 as illustrated in FIG. 4, in accordance with some embodiments. As illustrated in FIG. 5, the portable electronic device 500 includes an enclosure 510, which may correspond to one of the side walls 112-C. The enclosure 510 is joined to metal bands 512, which may correspond to a perimeter structure of the portable electronic device 500. The metal bands 512 are capable of increasing the stiffness of the enclosure 510.

Disposed below the metal bands 512 is a support plate 530. In some examples, the support plate 530 is capable of supporting operational components, such as the power supply unit 360, a circuit board, a wireless transceiver, a camera system, and the like. In some examples, the support plate 530 is formed of a non-metal material. Beneficially, the use of non-metal materials can reduce the amount of electromagnetic interference of the enclosure 310, especially with regard to antenna signals.

As illustrated in FIG. 5, the brace structure 520 is coupled to the enclosure 510 and/or the metal bands 512. The brace structure 520 supports the protruding trim structure 540 and the support plate 530. In some examples, the brace structure 520 is joined to the protruding trim structure 540 by at least one of an adhesive, a weld, a fastener, and the like. The protruding trim structure 540 includes an engagement surface defined by an overhang 548, where the overhang 548 is disposed at a non-parallel and/or non-perpendicular angle relative to the support plate 530. As described with reference to FIG. 3, the brace structure 520 includes walls 522 that extend towards the display trim 106 and the protective cover 108. In some examples, the walls 522 have a thickness that is between about 0.4 mm-0.6 mm. In other examples, the walls 522 have a thickness that is between about 0.1 mm-1 mm. It should be noted that the thickness of the walls 522 may be of any thickness that is sufficient to protect the operational component 550. Beneficially, the walls 522 provide an amount of stiffness that is sufficient to compensate for any natural deflection of the brace structure 520. According to some examples, the brace structure 520 is comprised of half hard steel, three quarter hard steel, metal injection molding, and the like. In some examples, the walls 522 of the brace structure 520 do not have a constant height (i.e., non-uniform height). In some examples, it may not be preferable for the walls 522 of the brace structure 520 to end at a region associated with the natural peak deflection of the brace structure 520.

According to some embodiments, the brace structure 520 is secured to the support plate 530 by an attachment feature 524 such as at least one of an adhesive, a weld, a fastener, and the like in order to limit bending of the support plate 530 and/or the brace structure 520. In particular, when the portable electronic device 500 is subject to a drop event, the impact and load that initially travels through the protruding trim structure 540 is likely to cause a load path to travel through to the support plate 530. In order to prevent the brace structure 520 from deflecting into the operational component 550, the brace structure 520 is hard captured to the back of the support plate 520 with the attachment feature 524. Additionally, hard capturing the brace structure 520 to the back of the support plate 530 may also limit bending of the support plate 520. In some examples, the support plate is between about 0.5 mm to about 1.5 mm thick. As illustrated in FIG. 5, the metal brace 520 may back up at least a majority (or substantially all) of the support plate 530.

As illustrated in FIG. 5, the protruding trim structure 540 is proud from the support plate 530. As a result, the protruding trim structure 540 may be susceptible to increased exposure to a load event when the portable electronic device 500 is exposed to a drop event. Accordingly, to minimize damage to the protruding trim structure 540 and its cosmetic appearance, the protruding trim structure 540 may be specially processed. In some examples, the external surface(s) of the protruding trim structure 540 may undergo at least one of a cladding, electroplating, anodizing, sputter deposition process, and the like such as to minimize the amount of abrasion and/or scratches that will detract from the aesthetic appearance of the protruding trim structure 540. Additionally, the protruding trim structure 540 may be processed to have an appearance that is generally uniform or identical to the enclosure 510, such as with respect to light reflectivity, color, texture, and the like. In some examples, the coating of a first surface 540-A of the protruding trim structure 540 that is parallel to the back wall 130 of the portable electronic device 500 may be stronger than the coating of a second surface 540-B of the protruding trim structure 540 that is angled (i.e., other than parallel) relative to the back wall 130. In particular, the first surface 540-A may be more susceptible to being scratched and may be require increased hardness and abrasion resistance than the second surface 540-B. According to some examples, the protruding trim structure 540 is formed of aluminum, an aluminum alloy, steel, stainless steel, titanium, and the like. According to some examples, the protruding trim structure 540 may be formed of one or more similar materials as the enclosure 510. In some instances, it may be difficult to apply a single coating with variations in abrasion resistance over both the protruding trim structure 540 and the trim structure 542. Therefore, by separating a single-part trim structure into two parts (i.e., the protruding trim structure 540 and the trim structure 542), these parts may be more easily treated according to their separate processes. In some examples, it may be difficult to color match the first surface 540-A of the protruding trim structure 540 to the enclosure 510 while also providing sufficient rigidity/stiffness. However, in other examples, the protruding trim structure 540 and the trim structure 542 may be formed as an integral single part.

According to some embodiments, the portable electronic device 500 includes an operational component 550 (e.g., a camera, etc.) that is carried at least in part within a cavity 546 of the protruding trim structure 540. According to some examples, the brace structure 520 acts as an alignment feature for the operational component 550. The brace structure 520 securely captures the protruding trim structure 540 and the trim structure 542. As illustrated in FIG. 5, the protruding trim structure 540 is directly attached to trim structure 542, where the trim structure 542 is joined to the cover layer 552 that overlays a portion of the operational component 550. In particular, because the trim structure 542 is attached to the cover layer 552, the trim structure 542 may absorb a greater share of a load that travels through the cover layer 552 than the protruding trim structure 540 when the portable electronic device 500 is subjected to a drop event.

According to some embodiments, the support plate 530 extends into a corner—e.g., the corner 308—of the portable electronic device 500. The support plate 530 adds stiffness to the corner 308, as well as helps to draw heat generated by the operational component 550 away from the operational component 550. For example, the support plate 530 may be comprised of a material having a higher conductivity coefficient than the material of the operational component 550.

As illustrated in FIG. 5, the protruding trim structure 540 is joined to a trim structure 542 by a fastening feature, such as an adhesive, undercut structure, weld, and the like. In some examples, the trim structure 542 and the protruding trim structure 540 are grounded together in order to prevent electrostatic discharge within the portable electronic device 500. The protruding trim structure 540 is hermetically sealed from the support plate 530 with an O-ring 544.

Figure 6:
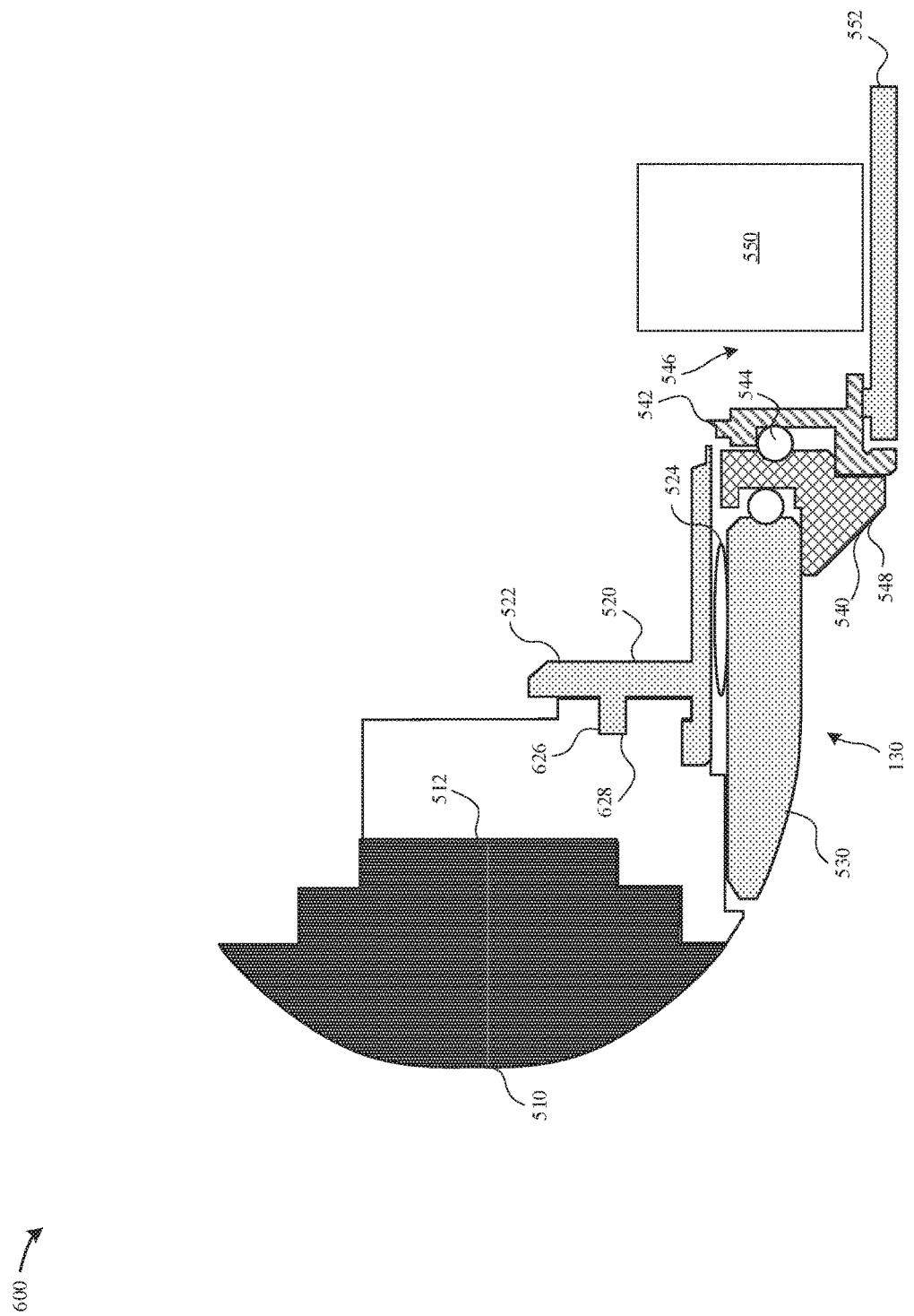
FIG. 6 illustrates a partial cross-sectional view of a portable electronic device that includes support structures for securing operational components, in accordance with some embodiments.

FIG. 6 illustrates a cross-sectional view of a portable electronic device 600 taken along the reference section B-B of the portable electronic device 400 as illustrated in FIG. 4, in accordance with some embodiments. As illustrated in FIG. 6, the portable electronic device 600 includes an enclosure 510 that is joined to a metal band 512, which may correspond to a perimeter structure of the portable electronic device 600. As illustrated in FIG. 6, the brace structure 520 is coupled to the metal band 512, where the metal band 512 includes an insert-molded piece 626 that holds an arm 628 of the brace structure 520 so as to prevent the brace structure 520 from deflecting away from the metal band 512 in the event that the portable electronic device 600 is subject to a drop event. Similar to the brace structure 520 of the portable electronic device 500, the portable electronic device 600 includes walls 522 that extend upwards and provide increased stiffness to compensate for any natural deflection of the brace structure 520 and/or the support plate 530.

Figure 7:
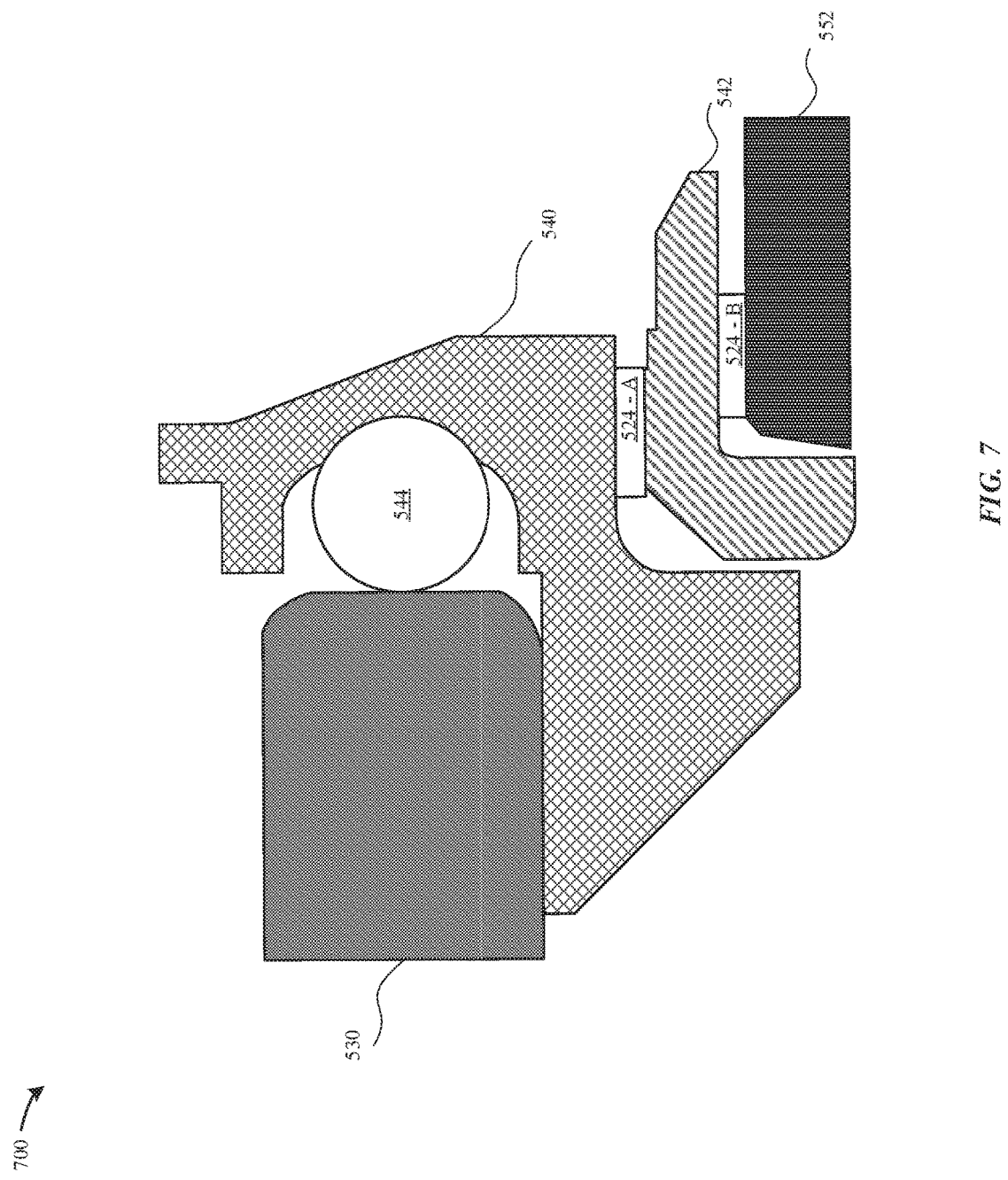
FIG. 7 illustrates a partial cross-sectional view of a portable electronic device that includes support structures for securing operational components, in accordance with some embodiments.

FIG. 7 illustrates a cross-sectional view of a portable electronic device 700 taken along the reference section C-C of the portable electronic device 400 as illustrated in FIG. 4, in accordance with some embodiments. As illustrated in FIG. 7, the portable electronic device 700 includes a protruding trim structure 540. In contrast to the portable electronic device 500, 600, the portable electronic device 700 does not include a brace structure 520. Rather, the protruding trim structure 540 is joined to the trim structure 542 by way of an attachment feature 524-A. In some examples, the protruding trim structure 540 of the portable electronic device 700 has an amount of stiffness that compensates for the absence of the brace structure 520. For example, when the portable electronic device 800 is subject to a drop event, the protruding trim structure 540 is capable of limiting an amount of bending/deflecting as a result of a load that passes through the protruding trim structure 540 so as to minimize the amount of load that is received by the support plate 530. The protruding trim structure 540 includes an engagement surface defined by an overhang 548, where the overhang 548 is disposed at a non-parallel and/or non-perpendicular angle relative to the support plate 530. The engagement surface of the overhang 548 may be capable of receiving the load.

Additionally, in contrast to the trim structure 542 of the portable electronic device 500, 600, the trim structure 542 is attached to the support plate 530 by way of an attachment feature 524-B. In some examples, the attachment feature 524-A, B is an adhesive, a weld, a fastener, or an interlock structure.

As illustrated in FIG. 7, the protruding trim structure 540 is directly attached to the support plate 530. As detailed herein, because the trim structure 542 is directly attached to the cover layer 552, the trim structure 542 may absorb a greater share of a load that travels through the cover layer 552 when the portable electronic device 700 is subjected to a drop event relative to the protruding trim structure 540 of the portable electronic device 500, 600.

Figure 8:
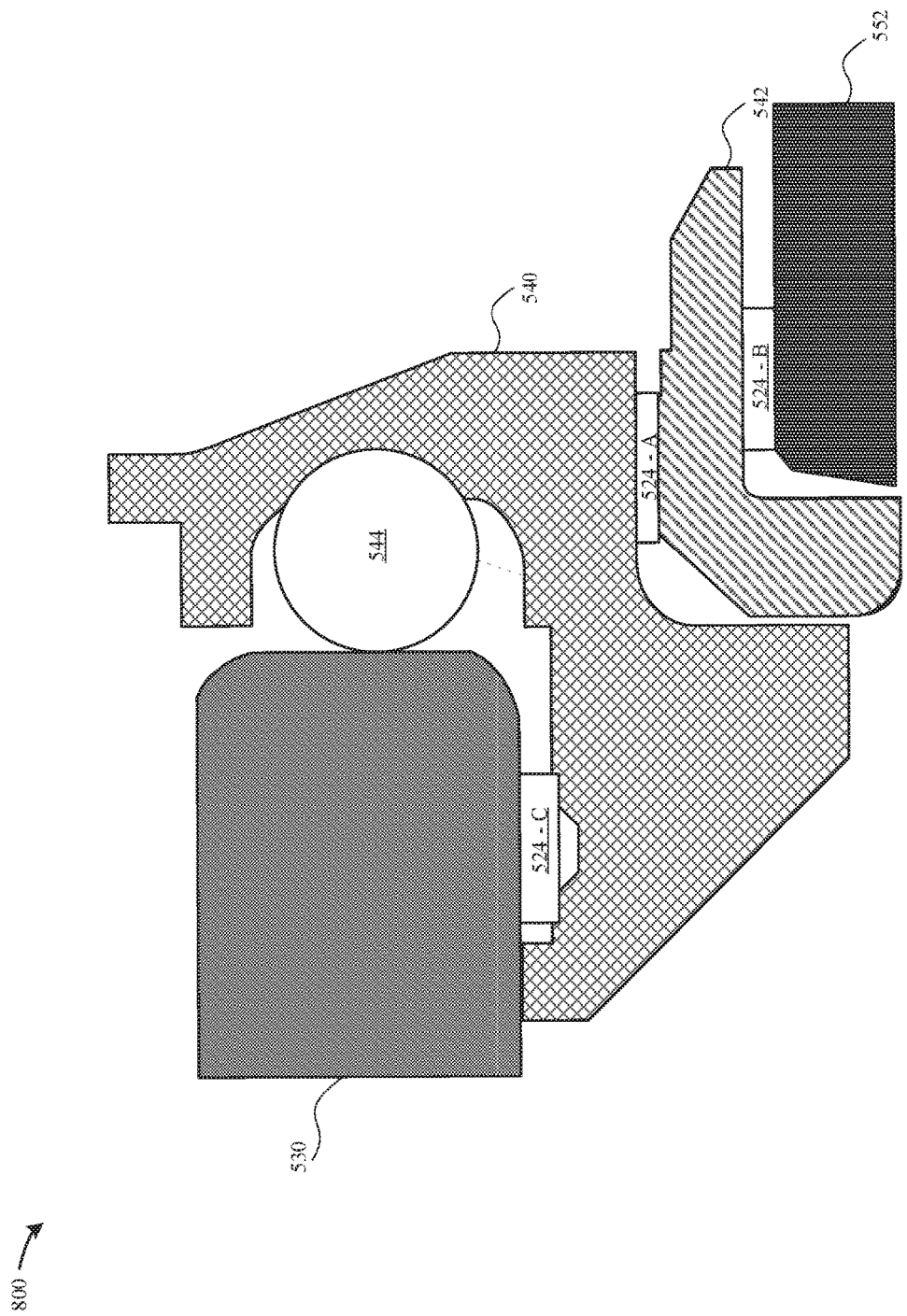
FIG. 8 illustrates a partial cross-sectional view of a portable electronic device that includes support structures for securing operational components, in accordance with some embodiments.

FIG. 8 illustrates a cross-sectional view of a portable electronic device 800 taken along the reference section C-C of the portable electronic device 400 as illustrated in FIG. 4, in accordance with some embodiments. As illustrated in FIG. 8, the portable electronic device 800 does not include a brace structure 520. Rather, the protruding trim structure 540 has an amount of stiffness that compensates for the absence of the brace structure 520. FIG. 8 further illustrates that the protruding trim structure 540 is attached to the trim structure 542 by way of an attachment feature 524-A and attached to the support plate 530 by way of an attachment feature 524-C. Therefore, unlike the protruding trim structure 540 of the portable electronic device 500, 600, the protruding trim structure 540 is not directly joined to the support plate 530.

As illustrated in FIG. 8, the trim structure 542 is attached to the cover layer 552 by way of an attachment feature 524-B. As detailed herein, the cover layer 552 overlays a portion of the operational component 550 so as to protect the operational component 550 from abrasions. The trim structure 542 is capable of absorbing a greater share of a load that travels through the cover layer 552 when the portable electronic device 800 is subjected to a drop event relative to the protruding trim structure 540 of the portable electronic device 500, 600.

Figure 9:
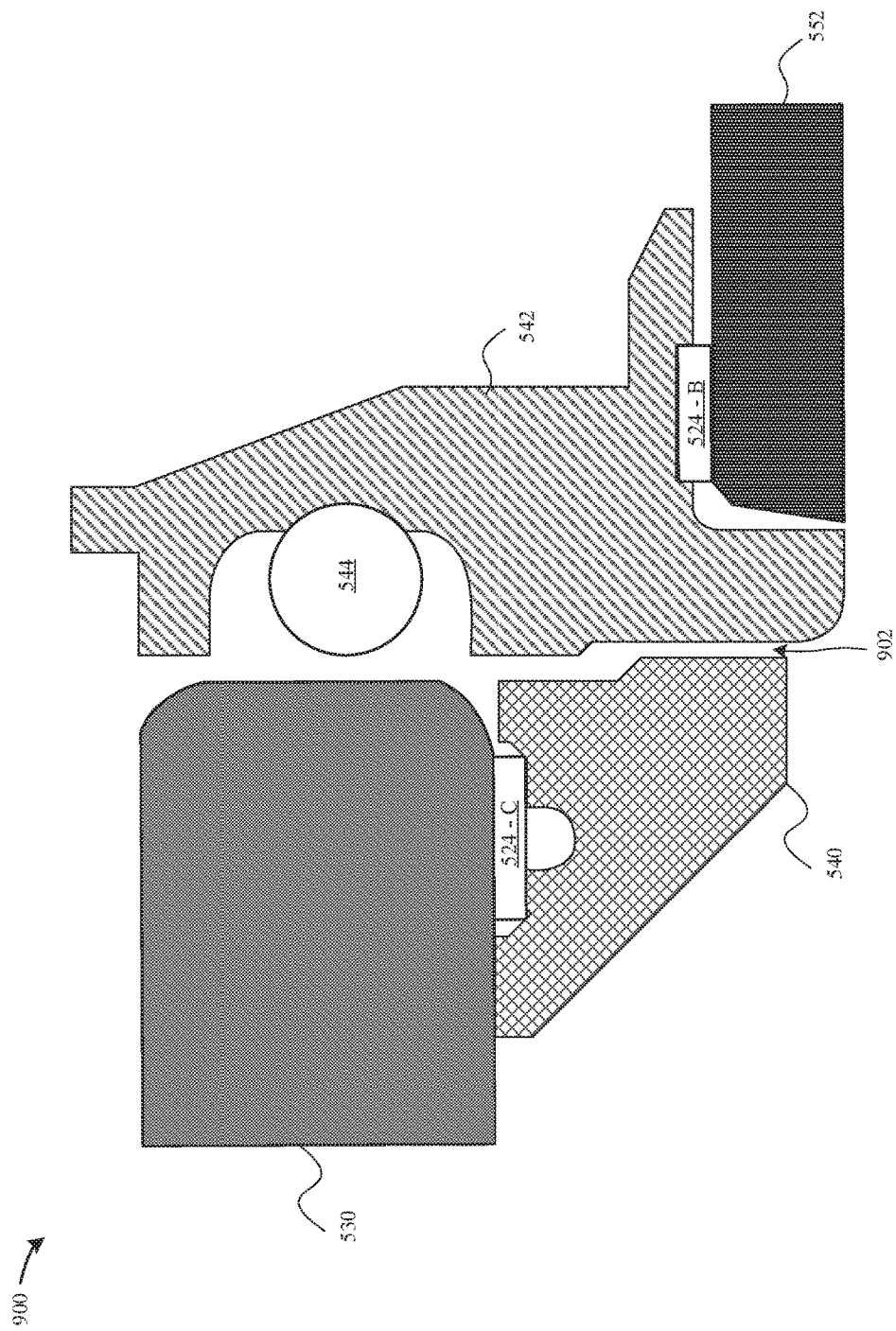
FIG. 9 illustrates a partial cross-sectional view of a portable electronic device that includes support structures for securing operational components, in accordance with some embodiments.

FIG. 9 illustrates a cross-sectional view of a portable electronic device 900 taken along the reference section C-C of the portable electronic device 400 as illustrated in FIG. 4, in accordance with some embodiments. As illustrated in FIG. 9, the portable electronic device 900 includes a protruding trim structure 540. In contrast to the portable electronic device 500, 600, the portable electronic device 900 does not include a brace structure 520. In some examples, the protruding trim structure 540 of the portable electronic device 900 has an amount of stiffness that compensates for the absence of the brace structure 520. As illustrated in FIG. 9, the protruding trim structure 540 is joined to the support plate 530 by way of an attachment feature 524-C. Additionally, a through-gap 902 separates the protruding trim structure 540 from the trim structure 542.

Figure 10:
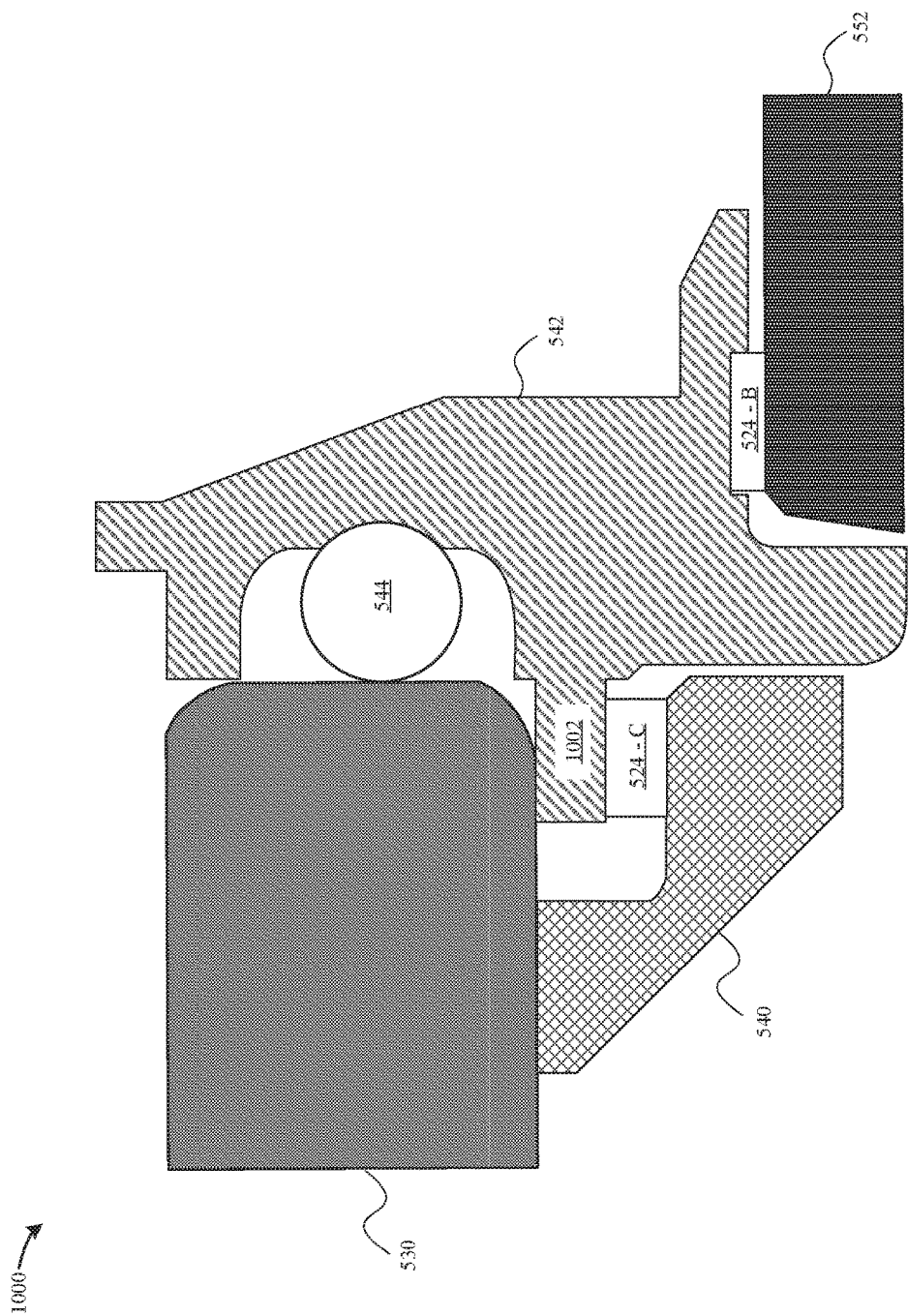
FIG. 10 illustrates a partial cross-sectional view of a portable electronic device that includes support structures for securing operational components, in accordance with some embodiments.
Figure 11:
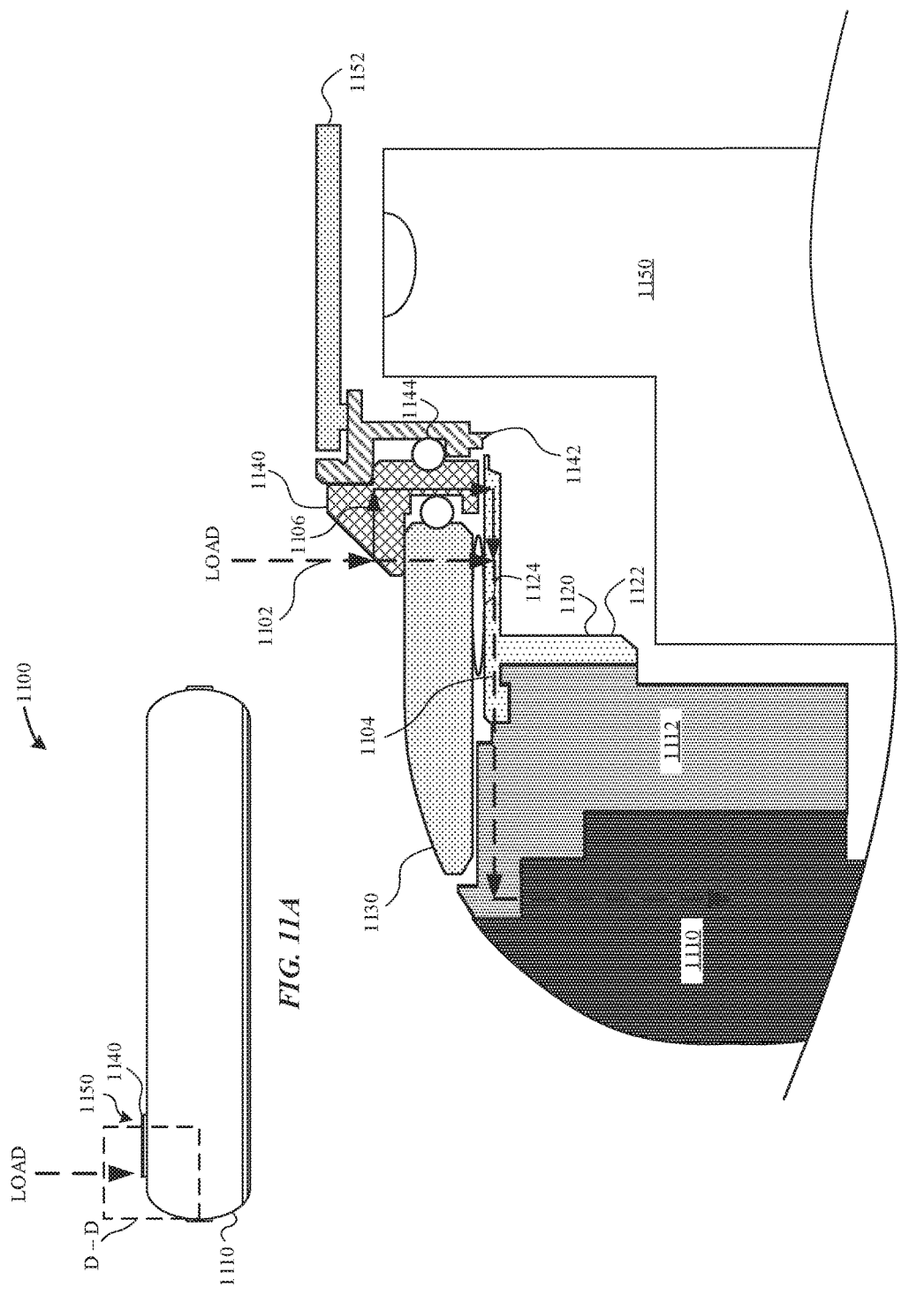
FIGS. 11A-11B illustrate various views of a load path that passes through support structures of a portable electronic device, in accordance with some embodiments.

FIG. 10 illustrates a cross-sectional view of a portable electronic device 1000 taken along the reference section C-C of the portable electronic device 400 as illustrated in FIG. 4, in accordance with some embodiments. In contrast to the portable electronic device 900, the protruding trim structure 540 of the portable electronic device 1000 is attached to the trim structure 542 by an attachment feature 524-C. Additionally, the protruding trim structure 540 is directly attached to the support plate 530.

In contrast to the portable electronic device 900, the trim structure 540 of the portable electronic device 1000 does not include the through-gap 902. Moreover, the trim structure 542 includes a ledge portion 1002 that is attached to the protruding trim structure 540 by the attachment feature 524-C.

FIG. 11A illustrates a side view of a portable electronic device 1100 in accordance with some embodiments. As illustrated in FIG. 11A, the portable electronic device 1100 includes an operational component 1150 that is carried at least in part by a protruding trim structure 1140. The protruding trim structure 1140 is joined to an enclosure 1100. In particular, FIG. 11A illustrates that the protruding trim structure 1140 is subject to a load during a drop event.

FIG. 11B illustrates a cross-sectional view of the portable electronic device 1100 taken along the reference section D-D as illustrated in FIG. 11A, in accordance with some embodiments. As illustrated in FIG. 11B, an external surface of the protruding trim structure 1140 may be subject to an amount of load force when the portable electronic device 1100 is subject to a drop event. FIG. 11B illustrates a load path 1102 that goes through the protruding trim structure 1140. The portable electronic device 1100 ensures that the operational components remain secured (i.e., not dislodged) within the enclosure 1100 regardless if the load path 1102 transitions into a first load path 1104 or a second load path 1106.

According to some examples, the load path 1102 transitions into a first load path 1104 that passes through the protruding trim structure 1140, an attachment feature (not illustrated) that attaches the protruding trim structure 1140 to a brace structure 1120, to the brace structure 1120, and then to the enclosure 1110 of the portable electronic device 1100. In this manner, the protruding trim structure 1140 can cause the load path 1102 to completely bypass the support plate 1130. Beneficially, by bypassing the support plate 1130, there is minimal risk that the load will bend and/or deflect the support plate 1130 so as to cause the support plate 1130 to deflect into the operational component 1150.

According to some examples, the load path 1102 transitions into a second load path 1106 that passes through the protruding trim structure 1140, the brace structure 1120, and then to the support plate 1130. However, because the support plate 1130 is backed by the brace structure 1120, the brace structure 1120 minimizes the deflection of the support plate 1120, thereby preventing the load from causing the support plate 1130 to deflect into the operational component 1150. According to some examples, the load path 1102 through the portable electronic device 1100 may represent a combination of the first and second load paths 1102, 1104.

As illustrated in FIG. 11B, the operational component 1150 and the protruding trim structure 1140 are positioned in proximity to a corner of the enclosure 1110 and offset of a midline of the portable electronic device 1100. Beneficially, positioning the operational component 1150 in proximity to the corner enables room in the cavity of the enclosure 1100 for the electronic components 362 (e.g., infrared camera, front-facing camera, etc.), the inductive charging coil 160, and the power supply unit 360. Furthermore, positioning the protruding trim structure 1140 and the accompanying brace structure 1120 in proximity to the enclosure 1110 strengthens the antenna signal.

Figure 12:
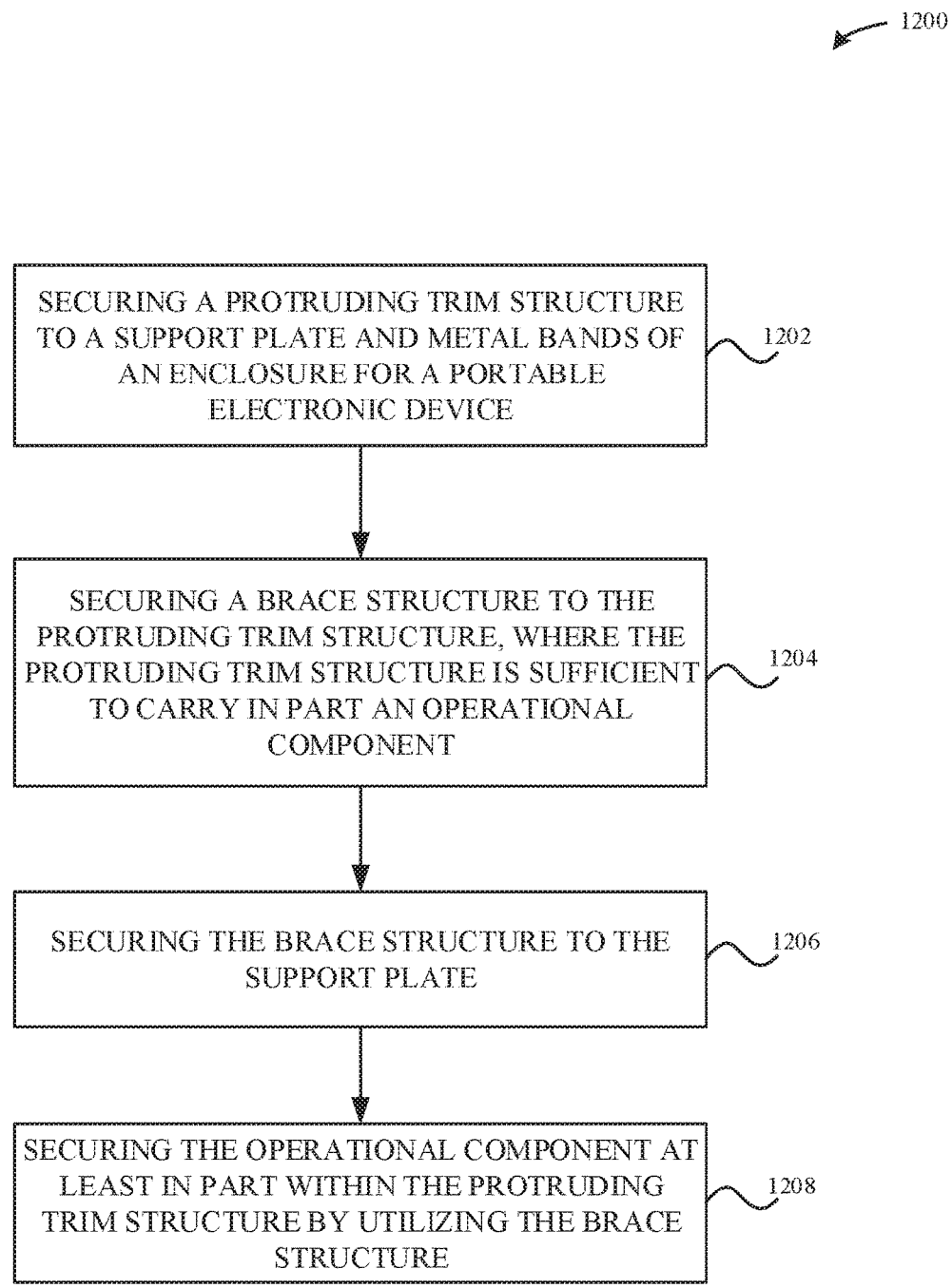
FIG. 12 illustrates a flowchart for forming support structures for a portable electronic device, in accordance with some embodiments.

FIG. 12 illustrates a flow diagram of a method 1200 for forming an enclosure for a portable electronic device that includes support structures for securing operational components, in accordance with some embodiments. As illustrated in FIG. 12, the method 1200 begins at step 1202 where a protruding trim structure 540 is secured to a support plate 530 and metal bands 512 of an enclosure 510 for a portable electronic device 500. Although the method 1200 is described with reference to the portable electronic device 500 of FIG. 5, it should be noted that the method can equally apply to any one of the portable electronic devices 100, 300, 600, 700, 800, 900, 100, or 1100 as described herein.

At step 1204, a brace structure 520 is secured to the protruding trim structure 540, where the protruding trim structure 540 is sufficient to carry in part an operational component 550.

At step 1206, the brace structure 520 is secured to a support plate 530 by an attachment feature. According to some examples, the attachment feature includes at least one of a weld, an adhesive, an interlock feature, an inter-molded part, and the like.

At step 1208, the operational component 550 is secured at least in part within a cavity of the protruding trim structure 540 by utilizing the brace structure 540.

Figure 13:
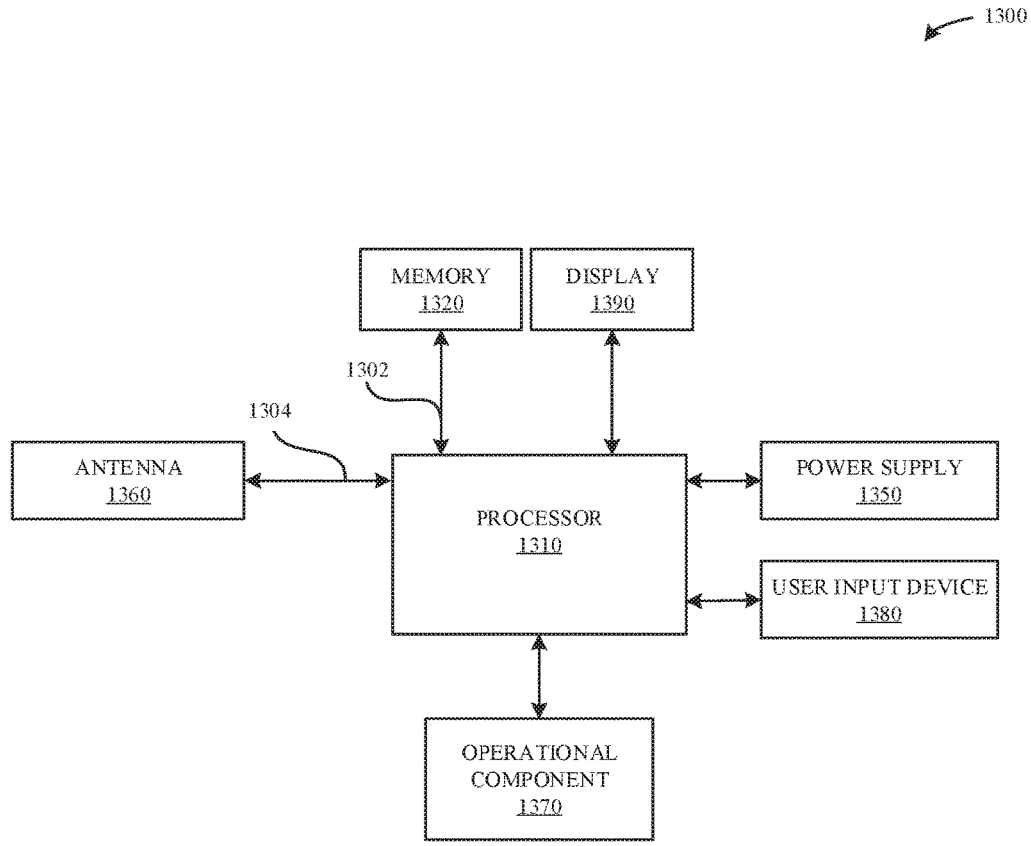
FIG. 13 illustrates a system diagram of a portable electronic device that is capable of implementing the various techniques described herein, according to some embodiments.

FIG. 13 illustrates a system diagram of a portable electronic device 1300 that is capable of implementing the various techniques described herein, according to some embodiments. In particular, the detailed view illustrates various components that can be included in the portable electronic device 100 as illustrated in FIG. 1.

As shown in FIG. 13, the portable electronic device 1300 can include a processor 1310 for controlling the overall operation of the portable electronic device 1300. The portable electronic device 1300 can include a display 1390. The display 1390 can be a touch screen panel that can include a sensor (e.g., capacitance sensor). The display 1390 can be controlled by the processor 1310 to display information to the user. A data bus 1302 can facilitate data transfer between at least one memory 1320 and the processor 1310. The portable electronic device 1300 can also include a network/bus interface 1304 that couples a wireless antenna 1360 to the processor 1310.

The portable electronic device 1300 can include a user input device 1380, such as a switch. The portable electronic device 1300 includes a power supply unit 1350, such as a lithium-ion battery. The portable electronic device 1300 also includes a memory 1320, which can comprise a single disk or multiple disks (e.g., hard drives), and includes a storage management module that manages one or more partitions within the memory 1320. In some embodiments, the memory 1320 can include flash memory, semiconductor (solid state) memory or the like. The portable electronic device 1300 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 1300.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A portable electronic device, comprising:
   an enclosure;
   a trim structure that protrudes from the enclosure, wherein the trim structure includes walls that define a cavity capable of carrying an electronic component within the cavity;
   a support plate that couples together the enclosure and the trim structure; and
   a brace structure that couples together the trim structure and the support plate, wherein the trim structure and the brace structure define a load path such that a load applied to the trim structure is redirected by the load path towards the brace structure and away from the electronic component.

2. The portable electronic device of claim 1, wherein the trim structure is capable of redirecting the load away from the support plate.

3. The portable electronic device of claim 1, wherein an external surface of the trim structure has a coating, and the coating and the enclosure have a color.

4. The portable electronic device of claim 1, wherein the trim structure includes an optically transparent window that overlays the electronic component.

5. The portable electronic device of claim 1, wherein the brace structure is grounded to the trim structure.

6. The portable electronic device of claim 1, wherein the support plate is coupled to the brace structure by at least one of an adhesive, a weld, or an interlock joint.

7. The portable electronic device of claim 1, wherein the trim structure is hermetically sealed from the support plate.

8. A portable electronic device, comprising:
   an enclosure having walls that define a cavity, the cavity capable of carrying an electronic component therein;
   a trim structure that is coupled to and extends from the enclosure, wherein the trim structure includes an overhang that cooperates with the walls to further define the cavity;
   a support plate that overlays at least a portion of the trim structure, wherein the overhang includes an engagement surface that is disposed between the support plate and a cover layer of the trim structure; and
   a brace structure that overlays at least a portion of the trim structure and at least a portion of the support plate, wherein the brace structure includes a flange that (i) is coupled to at least one of the walls, and (ii) extends away from the support plate.

9. The portable electronic device of claim 8, wherein the trim structure is disposed offset relative to a midline of the at least one wall that is coupled to the flange.

10. The portable electronic device of claim 8, wherein the engagement surface is other than parallel to the support plate and the trim structure.

11. The portable electronic device of claim 8, wherein the trim structure is coupled to the support plate by an adhesive.

12. The portable electronic device of claim 8, wherein the brace structure is coupled to the enclosure by at least one of an adhesive, a weld, an interlock joint, an insert-molded piece, or a fastener.

13. The portable electronic device of claim 8, wherein the flange has a variation in stiffness.

14. The portable electronic device of claim 8, wherein the trim structure is hermetically sealed from the support plate.

15. The portable electronic device of claim 8, wherein the cover layer shields the electronic component.

16. A portable electronic device including an enclosure, the enclosure having walls that define a cavity capable of carrying an electronic component therein, the portable electronic device comprising:
   a brace structure that includes at least one flange, wherein the at least one flange is secured to at least one of the walls;
   a support plate that is disposed along external surfaces of the brace structure and the at least one wall that is secured to the at least one flange; and
   a trim structure that is coupled to the at least one wall that is secured to the at least one flange, wherein the trim structure includes sides that (i) extend away from the support plate, and (ii) cooperate with the at least one wall to further define the cavity.

17. The portable electronic device of claim 16, further comprising:
   a peripheral support structure that is coupled to the brace structure and the enclosure.

18. The portable electronic device of claim 16, wherein the trim structure is hermetically sealed from the support plate.

19. The portable electronic device of claim 16, wherein the at least one flange has a variation in stiffness.

20. The portable electronic device of claim 16, wherein the at least one flange of the brace structure includes multiple flanges having different heights.

* * * * *